(12) United States Patent
Yamada (10) Patent No.: US 7,705,535 B2
(45) Date of Patent: Apr. 27, 2010

(54) DISPLAY PANEL, DISPLAY MODULE FOR MOBILE USING DISPLAY PANEL, AND ELECTRONIC APPARATUS

(75) Inventor: Tadashi Yamada, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 414 days.

(21) Appl. No.: 11/354,095

(22) Filed: Feb. 15, 2006

(65) Prior Publication Data

US 2006/0202617 A1    Sep. 14, 2006

(30) Foreign Application Priority Data

Mar. 11, 2005    (JP) .............................. 2005-068687

(51) Int. Cl.
*H01J 1/62*    (2006.01)

(52) U.S. Cl. .................. 313/512; 313/504; 445/24; 445/25

(58) Field of Classification Search ......... 313/493–512; 445/24–25

See application file for complete search history.

(56) References Cited

U.S. PATENT DOCUMENTS 6,081,071 A * 6/2000 Rogers ....................... 313/512

2003/0164674 A1 * 9/2003 Imamura ................. 313/493
2004/0051449 A1 * 3/2004 Klausmann et al. ......... 313/512
2005/0168143 A1 * 8/2005 Kum et al. ................. 313/512

FOREIGN PATENT DOCUMENTS

| JP | A-2002-141171 | 5/2002 |
| JP | A 2002-216948 | 8/2002 |
| JP | A-2003-163076 | 6/2003 |
| JP | A 2003-208976 | 7/2003 |
| JP | A 2003-217826 | 7/2003 |
| JP | A 2004-296288 | 10/2004 |

* cited by examiner

*Primary Examiner*—Nimeshkumar D Patel
*Assistant Examiner*—Mary Ellen Bowman
(74) *Attorney, Agent, or Firm*—Oliff & Berridge, PLC (57) ABSTRACT

A display panel includes a light-emitting-element substrate in which a plurality of pixels each having a light-emitting element are arranged in a matrix shape, and a sealing substrate that is bonded to the light-emitting-element substrate so as to airtightly seal the entire light-emitting elements of the plurality of pixels. In the sealing substrate, a concave portion that houses the light-emitting elements of the plurality of pixels therein is formed. On an inner surface of the sealing substrate facing the light-emitting elements, a reinforcing member that protrudes to maintain a gap between the sealing substrate and the light-emitting elements is formed.

16 Claims, 9 Drawing Sheets

DISPLAY PANEL, DISPLAY MODULE FOR MOBILE USING DISPLAY PANEL, AND ELECTRONIC APPARATUS

BACKGROUND

1. Technical Field

The present invention relates to a display panel, such as an organic EL panel or the like, to a display module for a mobile using the display panel, and to an electronic apparatus.

2. Related Art

In recent years, an organic electroluminescent (EL) panel using an organic EL element attracts attention in view of low power consumption, a wide viewing angle, and high contrast superior to other devices.

As such an organic EL panel, an organic EL element having a substrate, on which a plurality of pixel electrodes, organic EL elements, thin film transistors, and a plurality of wiring lines are formed, a sealing member which is formed by bonding a rectangular convex portion to a peripheral portion of the substrate so as to cover all of a plurality of pixels has been known. Further, in the inner surface of the sealing member, an absorbent for absorbing moisture or the like is adhered (for example, see JP-A-2003-208976).

Further, when the organic EL panel is enlarged, an organic EL panel which prevents damages due to stress of the sealing member and damages of the organic EL element due to a deformation of the sealing member has been known (see JP-A-2002-216948). This organic EL panel has a light-transmissive support substrate, a laminate that is provided on the support substrate and in which an organic layer having a light-emitting layer is interposed between a first electrode and a second electrode, a sealing substrate that is provided on the support substrate and covers the laminate airtight, and a reinforcing plate that is provided on the sealing substrate.

In the related art organic EL panel described in JP-A-2002-216948, the reinforcing plate is bonded onto the sealing substrate so as to prevent the sealing substrate from being curved and damaged. Accordingly, there is a problem in that the thickness of the entire display panel is increased by the reinforcing plate.

SUMMARY

An advantage of some aspects of the invention is that it provides a display panel which can promote enlargement while suppressing an increase in thickness, a display module for a mobile using such a display panel, and an electronic apparatus.

Another advantage of some aspects of the invention is that it provides a large display panel that can perform high-quality display with long life span, a display module for a mobile using such a display panel, and an electronic apparatus.

According to an aspect of the invention, a display panel includes a light-emitting-element substrate in which a plurality of pixels each having a light-emitting element are arranged in a matrix shape, and a sealing substrate that is bonded to the light-emitting-element substrate so as to airtightly seal the entire light-emitting elements of the plurality of pixels. In the sealing substrate, a concave portion that houses the light-emitting elements of the plurality of pixels therein is formed. On an inner surface of the sealing substrate facing the light-emitting elements, a reinforcing member that protrudes to maintain a gap between the sealing substrate and the light-emitting elements is formed.

According to this configuration, when the sealing substrate is curved toward the light-emitting element, a front end of the reinforcing member hits an electrode of the light-emitting element, for example, when the light-emitting element is an organic EL element, a cathode, and thus the sealing substrate is deterred from being deformed beyond that, such that the sealing substrate is prevented from being damaged. Further, since the reinforcing member is formed in the inner surface of the sealing substrate in order to prevent the sealing substrate from being damaged, the thickness of the entire display panel can be reduced, as compared with a display panel in which a reinforcing plate is bonded to an outer surface of the sealing substrate.

In the display panel according to the aspect of the invention, the display panel may have a plurality of real display regions displaying different images within an effective display area, and the reinforcing member may be provided so as to be located in non-display regions among the plurality of real display regions.

According to this configuration, in case of forming a display panel, having a large size, which displays different images by the plurality of real display regions of the effective display area, since the reinforcing member is provided so as to be located in the non-display regions among the plurality of real display regions, an influence on each of the real display regions by the reinforcing member is suppressed. On the other hand, thermal conductivity is changed between a portion where the reinforcing member is formed and a portion where the reinforcing member is not formed. Accordingly, if lighting is maintained for a long time, a degradation characteristic of the light-emitting element may be changed between the portion where the reinforcing member is formed and the portion where the reinforcing member is not formed, and thus display quality may be degraded or life span is decreased. In the display panel according to the aspect of the invention, however, since the reinforcing member is provided so as to be located in the non-display regions among the plurality of real display regions, display quality can be suppressed from being degraded and life span can be suppressed from being decreased. Therefore, a large display panel which can perform high-quality display with long life span can be implemented. Moreover, when such a large display panel is mounted on an installment panel of a vehicle, such as an automobile or the like, it is effective to display images, such as a speedometer, a tachometer, a map screen of a navigation device, and the like, as different images displayed by the plurality of real display regions within the effective display area.

In the display panel according to the aspect of the invention, the sealing substrate may have a rectangular convex portion that surrounds the concave portion, and the reinforcing member may have bridges that extend between two opposing convex portions of the rectangular convex portion. According to this configuration, the reinforcing member has the bridges that extend between the two opposing convex portions of the rectangular convex portion of the sealing substrate, and thus, with the bridges, the sealing substrate can be prevented from being damaged.

In the display panel according to the aspect of the invention, the concave portion of the sealing substrate may be divided into a plurality of concave portions by the reinforcing member, and, in each of the plurality of concave portions, a plate-shaped desiccant for absorbing moisture may be housed to be adhered to the inner surface. According to this configuration, the plurality of concave portions divided by the reinforcing member correspond to the plurality of real display regions, and the desiccant is housed in each of the plurality of concave portions. Therefore, for each the real display regions of one display panel, moisture intruding into each of the concave portions of the sealing substrate can be absorbed by the desiccant in each of the concave portions, and thus the light-emitting element can be suppressed from being degraded.

In the display panel according to the aspect of the invention, the sealing substrate may have a rectangular convex portion that surrounds the concave portion, and the reinforcing member may have a protrusion that is spaced apart from the convex portion. According to this configuration, the reinforcing member has the protrusion that is spaced apart from the convex portion of the sealing substrate, and thus, with the protrusion, the sealing substrate can be prevented from being damaged.

In the display panel according to the aspect of the invention, a plate-shaped desiccant for absorbing moisture may be housed in a space around the protrusion in the concave portion of the sealing substrate to be adhered to the inner surface. According to this configuration, since the desiccant is housed in the space around the protrusion in the concave portion of the sealing substrate, moisture intruding into the concave portion of the sealing substrate can be absorbed by the desiccant, and thus the light-emitting element can be suppressed from being degraded.

In the display panel according to the aspect of the invention, each of the light-emitting elements may be an electroluminescent element. According to this configuration, life span of an electroluminescent panel, such as an organic EL panel using an electroluminescent element can be increased.

According to another aspect of the invention, a display module for a mobile includes the above-described display panel. According to this configuration, a display module for a mobile in which the size of the panel is increased and which is reduced in thickness can be implemented. Further, when different images are displayed by a plurality of real display regions of one display panel, a display module for a mobile which has favorable visibility, perform high-quality display, and has long life span can be implemented by the plurality of real display regions of a display panel having a large size. Therefore, when the display module is mounted on a vehicle, such as an automobile or the like, an aircraft, a vessel, a trolley car, in which durability or safety is made much account, or the like, a speed of a mobile, a rev count, map information of a navigation device, and the like can be displayed by the plurality of real display regions with high quality for a long time.

According to still another aspect of the invention, an electronic apparatus includes the above-described display panel. According to this configuration, an electronic apparatus which is reduced in thickness with the increase in size of a display panel can be implemented. Further, even when the size of the display panel is increased, an electronic apparatus which can perform high-quality display with long life span can be implemented.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments which specify the invention will be described with reference to the drawings. Moreover, in the descriptions of the individual embodiments, the same parts are represented by the same reference numerals and the repeated descriptions thereof will be omitted.

First Embodiment

Figure 1:
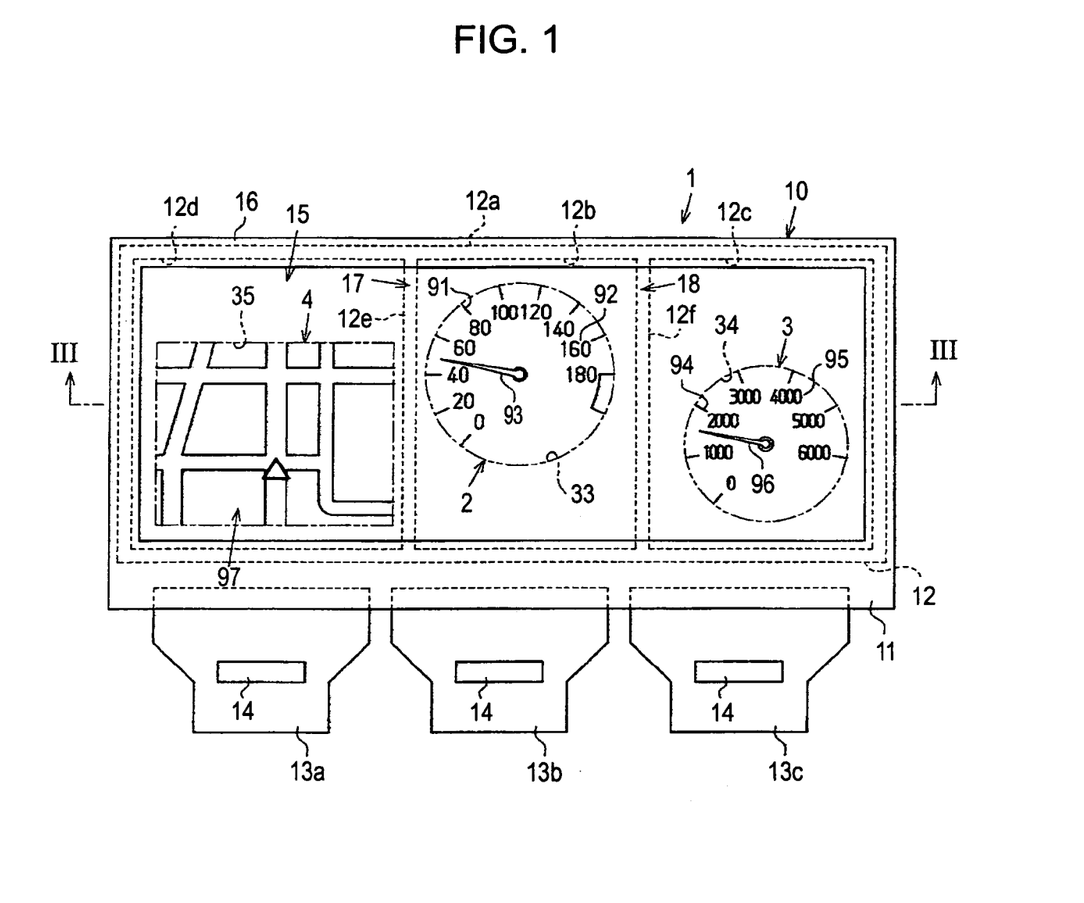
FIG. 1 is a plan view showing an entire organic EL panel according to a first embodiment of the invention.
Figure 2:
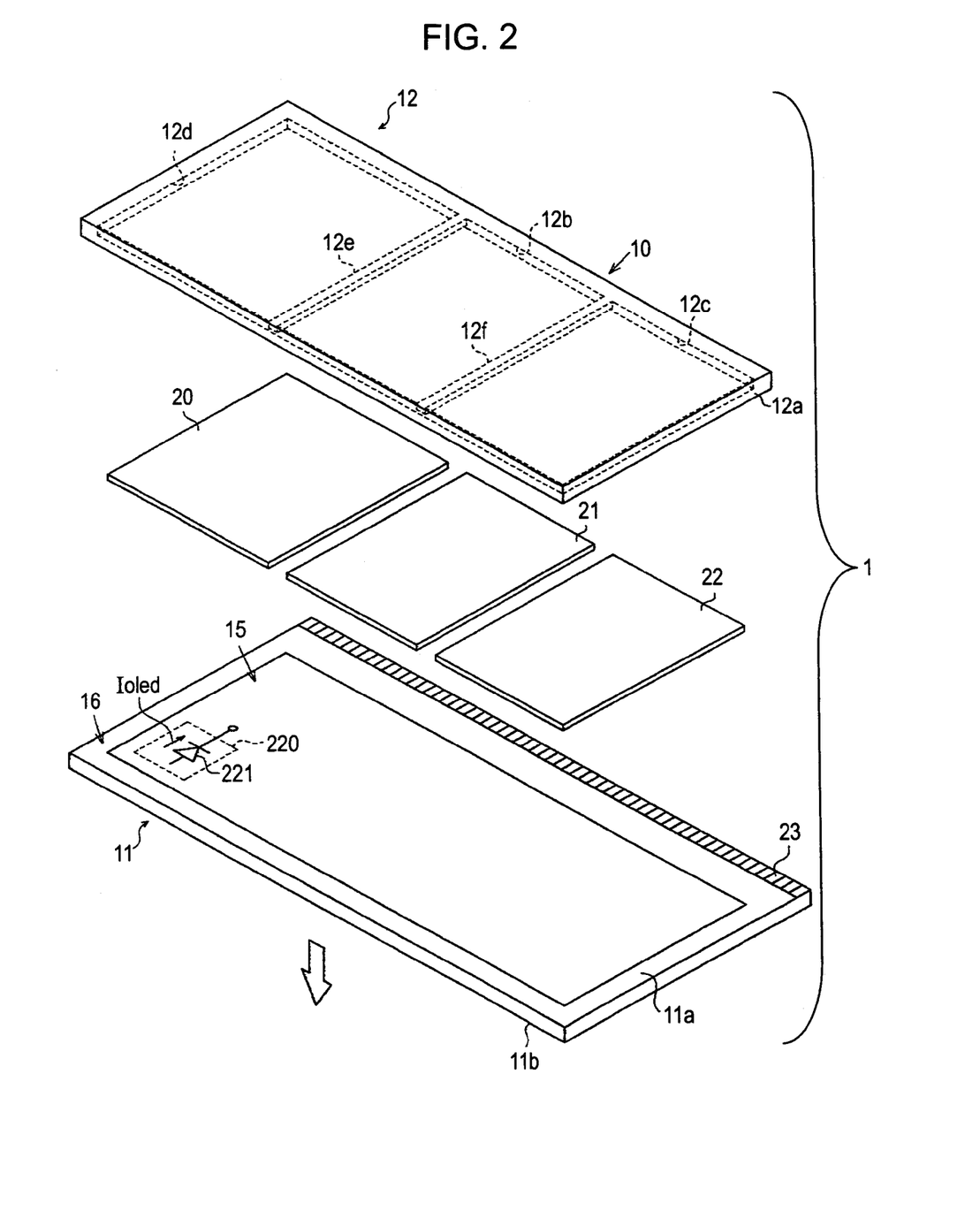
FIG. 2 is an exploded perspective view showing the organic EL panel.
Figure 6:
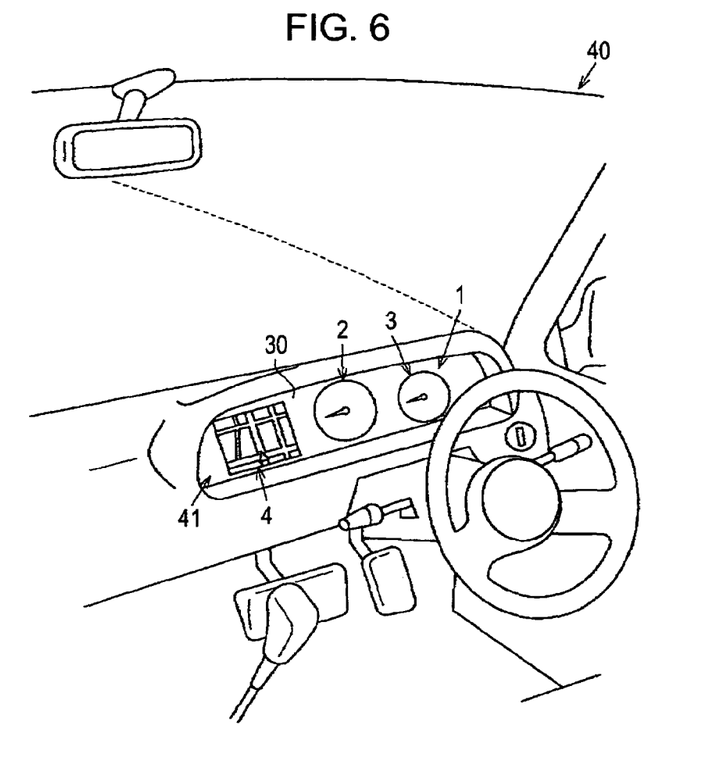
FIG. 6 is a perspective view showing the interior of a vehicle on which a display module for a mobile using the organic EL panel is mounted.
Figure 7:
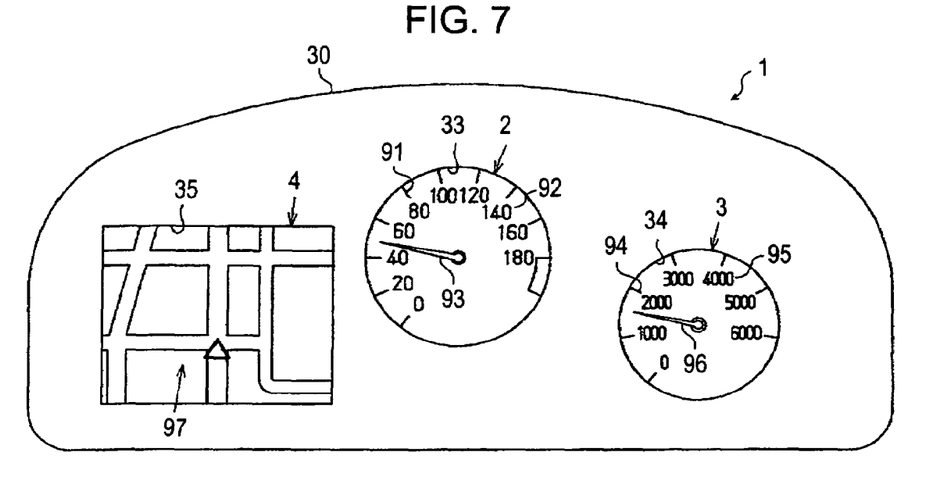
FIG. 7 is a plan view showing the display state of the display module.

An organic EL panel according to a first embodiment will be described with reference to FIGS. 1 to 7. In the first embodiment, an organic EL panel which is used in a display module for a mobile will be described as an example. FIG. 1 shows an organic EL panel according to the first embodiment, and FIG. 2 is an exploded perspective view of the organic EL panel. FIG. 6 shows the interior of a vehicle on which a display module for a mobile is mounted, and FIG. 7 shows the display state of the display module for a mobile.

As shown in FIG. 1, the display module 1 for a mobile has one organic EL panel 10 which serves as a display panel. The organic EL panel 10 is an electroluminescent panel in which an electroluminescent (EL) element is used as a light-emitting element. The organic EL panel 10 has a plurality (in this embodiment, three) of real display regions 2, 3, and 4 displaying different images within an effective display area 15.

In the organic EL panel 100 of the display module 1 for a mobile shown in FIG. 1, as an example, scales 91, figures 92, and an indicator 93 of a speedometer for displaying a speed of a vehicle are displayed in an analog manner by the central real display region 2. By the real display region 3 on the right side of the real display region 2, scales 94, figures 95, and an indicator 96 of a tachometer for displaying a rev count of the vehicle, such as an automobile or the like, are displayed. Further, by the real display region 4 on the left side of the real display region 2, an image 97, such as map information of a car navigation device or the like, is displayed. Moreover, on the real display region 4, an image of a television or an image of a DVD device can be also displayed.

Figure 3:
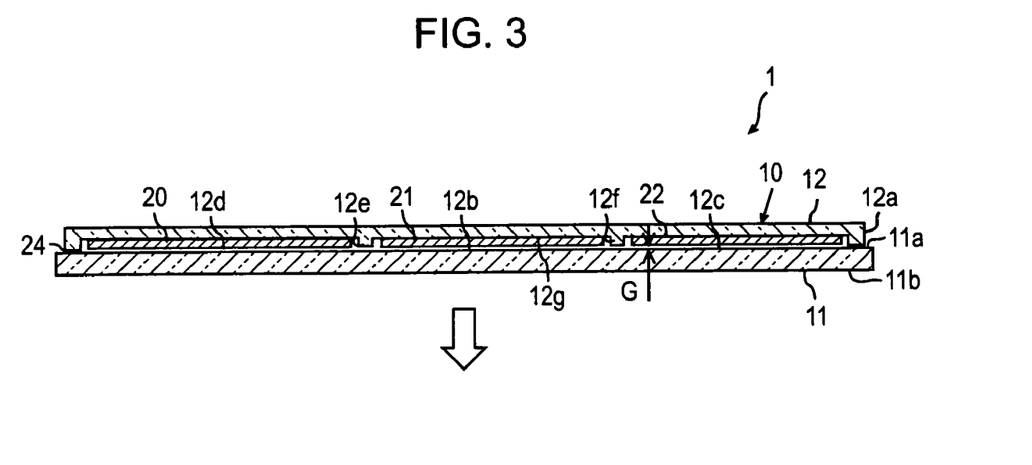
FIG. 3 is a cross-sectional view taken along the line III-III of FIG. 1.

As shown in FIGS. 2 and 3, the organic EL panel 10 has a light-emitting-element substrate 11 in which a plurality of pixels 220, each of which has an organic EL element 221 as an electroluminescent element, are arranged in a matrix shape, and a sealing substrate 12 which is bonded to the light-emitting-element substrate 11 so as to over seal all the light-emitting elements 221 of the plurality of pixels. In FIG. 2, some of the plurality of pixels 220 are shown.

On the light-emitting-element substrate 11, though not shown in FIGS. 2 and 3, rectangular pixel electrodes, each of which serves as an anode, are formed in a matrix shape. On each of the pixel electrodes, for example, a hole injecting/transporting layer and a light-emitting layer are sequentially laminated, and a cathode is formed over an almost entire surface of the substrate on which the light-emitting layer is formed. Further, to each of the pixel electrodes, a thin film transistor (TFT) or the like is electrically connected. Each pixel electrode, the hole injecting/transporting layer and the light-emitting layer formed on the pixel electrode, and the cathode forms the organic EL element 221 of each pixel 220. In addition, as shown in FIG. 2, on the light-emitting-element substrate 11, a terminal portion 23 for a plurality of wiring lines including a plurality of power lines, a plurality of signal lines, and a plurality of control lines is formed.

Figure 4:
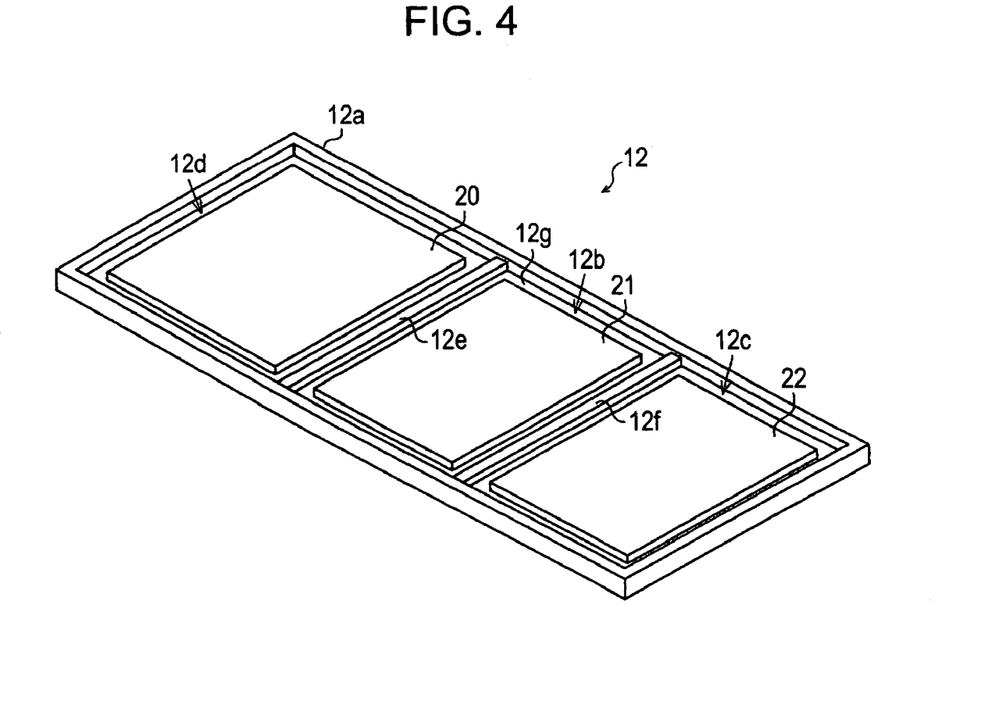
FIG. 4 is a perspective view showing a state in which a desiccant is housed in a sealing substrate of the organic EL panel.

As shown in FIGS. 2 to 4, the sealing substrate 12 is formed in a cylindrical shape with a bottom which has a rectangular convex portion 12a and formed of, for example, a transparent glass substrate. A lower end surface of the convex portion 12a of the sealing substrate 12 is bonded to one surface 11a of the light-emitting-element substrate 11 by an adhesive 24 such that the sealing substrate 12 covers all the organic EL elements 221 of the plurality of pixels 220 (the entire cathode of each organic EL element 221) (see FIG. 3). One surface 11a is a surface opposite to the other surface (light emergent surface) 11b through which light emitted from the organic EL element 221 of each pixel 220 exits.

Further, as shown in FIGS. 2 to 4, in the sealing substrate 12, three concave portions 12b, 12c, and 12d are formed. The three concave portions 12b, 12c, and 12d correspond to the three real display regions 2, 3, and 4 shown in FIG. 1, and each of the three concave portions 12b, 12c, and 12d houses the organic EL elements 221 of the plurality of pixels 220 within each real display region. By the three concave portions 12b, 12c, and 12d, all the organic EL elements 221 of all the pixels 220 within the effective display area 15 of one organic EL panel 10 are housed. Here, the effective display area 15 is a rectangular active area (light-emitting area) including all the pixels 20 within one organic EL panel 10. Further, in FIG. 1, reference numeral 16 denotes a non-light-emitting area around the effective display area 15.

Further, in the sealing substrate 12, two reinforcing members 12e and 12f which protrude so as to have a gap G (see FIG. 3) with respect to the cathodes of the individual organic EL elements 221 (electrodes of light-emitting elements) are formed. The reinforcing members 12e and 12f are provided so as to be located within non-display regions 17 and 18 (see FIGS. 1 and 2) among the three real display regions 2, 3, and 4. Each of the reinforcing members 12e and 12f has a bridge that extends between two opposing convex portions of the rectangular convex portion 12a. That is, the reinforcing member 12e is provided so as to be located within the non-display region 17 between the circular real display region 2 and the rectangular real display region 4. Further, the reinforcing member 12f is provided so as to be located within the non-display region 18 between the circular real display region 2 and the rectangular real display region 3 (see FIG. 1).

The sealing substrate 12 having such a configuration is manufactured by digging one transparent substrate with a sand blast method. At this time, the glass substrate is dug by the sand blast method such that the rectangular convex portion 12a surrounding the three concave portions 12b, 12c, and 12d, and the two reinforcing members 12e and 12f remain, and thus the three concave portions 12b, 12c, and 12d are formed in the glass substrate.

In the sealing substrate 12 manufactured in such a manner, the three concave portions 12b, 12c, and 12d are divided by the two reinforcing members 12e and 12f and form separate spaces. Further, as shown in FIGS. 2 to 4, in the three concave portions 12b, 12c, and 12d, plate-shaped desiccants 20, 21, and 22 for absorbing moisture are adhered to an inner surface 12g of the sealing substrate 12 to be individually housed.

In addition, as shown in FIG. 1, the display module 1 for a mobile having such an organic EL panel 10 has three flexible wiring boards 13a to 13c, which are connected to the light-emitting-element substrate 11 of the organic EL panel 10, and a panel cover 30.

An output terminal portion (not shown) of each of the three flexible wiring boards 13a to 13c and the terminal portion 23 of the light-emitting-element substrate 11 are thermally press-bonded to each other via an adhesive of an anisotropy conductive film to be electrically connected to each other. Further, on each of the flexible wiring boards 13a to 13c, a driver IC 14 including a data line driving circuit (which drives the organic EL elements 221 of each of the three real display regions 2, 3, and 4) is mounted.

The panel cover 30 is fixed onto the surface of the organic EL panel 10, that is, the other surface (light emergent surface) 11b of the light-emitting-element substrate 11. In the panel cover 30, three openings (through holes) 33 to 35 are provided through which the three real display regions 2, 3, and 4 displaying different images within the effective display area 15 of the organic EL panel 10 are viewed from the outside (see FIGS. 1 and 7). The openings 33 and 34 are circular openings, and the opening 35 is a rectangular opening.

As shown in FIG. 6, the display module 1 for a mobile in which the panel cover 30 is fixed to the surface of the organic EL panel 10 is mounted on an installment panel 41 of a vehicle 40, such as an automobile or the like. In the organic EL panel 10 of the display module 1 for a mobile mounted on the installment panel 41 in such a manner, as shown in FIG. 7, the three real display regions 2, 3, and 4 display different images.

In the organic EL panel 10 having such a configuration, if the sealing substrate 12 is curved from a state shown in FIG. 3 toward the organic EL elements 221 of the light-emitting-element substrate 11, front ends of the reinforcing members 12e and 12f hit the cathodes (electrodes) of the individual light-emitting elements 221. Therefore, the sealing substrate 12 is deterred from being deformed beyond that, and thus the sealing substrate 12 can be prevented from being damaged.

According to the first embodiment having such a configuration, the following advantages can be obtained.

In the sealing substrate 12, on the inner surface 12g facing the cathodes of the organic EL elements 221 of the plurality of pixels 220, the two reinforcing members 12e and 12f which protrude so as to have the gap G with respect to the cathodes of the organic EL elements 221 are formed. According to such a configuration, if the sealing substrate 12 is curved toward the cathodes of the organic EL elements 221, the front ends of the reinforcing members 12e and 12f hit the cathodes of the organic EL elements 221, and the sealing substrate 12 is deterred from being deformed beyond that, such that the sealing substrate 12 is prevented from being damaged. Further, on the inner surface 12g of the sealing substrate 12, the reinforcing members 12e and 12f are formed to prevent the sealing substrate 12 from being damaged, and thus the thickness of the entire organic EL panel 10 can be reduced, as compared with the related art display panel in which the reinforcing plate is bonded to the outer surface of the sealing substrate. Therefore, enlargement of the organic EL panel 10 can be promoted while the organic EL panel 10 is suppressed from being thickened. As a result, a large organic EL panel 10 which is reduced in thickness can be implemented.

The organic EL panel 10 has the three real display regions 2, 3, and 4 displaying different images within the effective display area 15, and the two reinforcing members 12e and 12f are correspondingly provided so as to be located within the non-display regions 17 and 18 among the three real display regions 2, 3, and 4. According to such a configuration, when a large organic EL panel 10 in which different images are displayed by the three real display regions 2, 3, and 4 within the effective display area 15 is formed, an influence on display in each of the real display regions by the reinforcing members 12e and 12f is suppressed. Further, since the reinforcing members 12e and 12f are provided so as to be located within the non-display regions among the three real display regions 2, 3, and 4, display quality can be suppressed from being degraded, and life span can be suppressed from being decreased. Therefore, a large display panel which can perform high-quality display with long life span can be implemented.

In the organic EL panel 10, each of the reinforcing members 12e and 12f has the bridge that extends between the two opposing convex portions of the rectangular convex portion 12a of the sealing substrate 12, and thus, with the bridge, the sealing substrate 12 can be prevented from being damaged.

In the organic EL panel 10, the concave portion of the sealing substrate 12, in which all the organic EL elements 221 of the plurality of pixels (all cathodes) are housed, is divided into the three concave portions 12b, 12c, and 12d by the two reinforcing members 12e and 12f. In the three concave portions 12b, 12c, and 12d, the plate-shaped desiccants 20, 21, and 22 for absorbing moisture are adhered to the inner surface 12g of the sealing substrate 12 to be individually housed. According to such a configuration, for each of the real display regions 2, 3, and 4 in one organic EL panel 10, moisture intruding into the individual concave portions 12b, 12c, and 12d of the sealing substrate 12 can be individually absorbed by the desiccants 20, 21, and 22 in the individual concave portions, and thus the organic EL elements 221 can be prevented from being degraded.

Since the reinforcing members 12e and 12f are provided on the sealing substrate 12, not on the light-emitting-element substrate 11, the light-emitting-element substrate 11 is common to various specifications, and only the sealing substrate 12 can be changed according to the specification. Therefore, from the plurality of real display regions of one organic EL panel, a real display region to be used can be changed by a user, and thus a plurality of specifications can be arranged at low cost.

When the organic EL panel 10 having a large size is mounted on the installment panel of the vehicle, such as an automobile or the like, it is effective to display images, such as a speedometer, a tachometer, a map screen of a navigation device, and the like, as different images displayed by the plurality of real display regions 2 to 4 within the effective display area 15.

Since the reinforcing members 12e and 12f are formed on the inner surface 12g of the sealing substrate 12, a display module for a mobile in which the size of the organic EL panel 10 is increased and which is reduced in thickness can be implemented.

In the display module 1 for a mobile using the organic EL panel 10, a display module for a mobile which has favorable visibility, perform high-quality display, and has long life span can be implemented by the three real display regions 2 to 4 of the organic EL panel having a large size. Therefore, when the display module is mounted on a mobile, for example, a vehicle, such as an automobile or the like, an aircraft, a vessel, a trolley car, or the like, in which durability or safety is made much account, a speed of a mobile, a rev count, map information of a navigation device, and the like can be displayed by the three real display regions 2 to 4 with high quality for a long time.

Second Embodiment

An organic EL panel 10A according to a second embodiment will be described with reference to FIGS. 8 to 11. The organic EL panel 10A is also used in the display module 1 for a mobile, like the organic EL panel 10 according to the first embodiment. The organic EL panel 10A according to the second embodiment is different from the first embodiment in that the number of a plurality of real display regions displaying different images within the effective display area 15 is two (real display regions 2 and 3).

Figure 8:
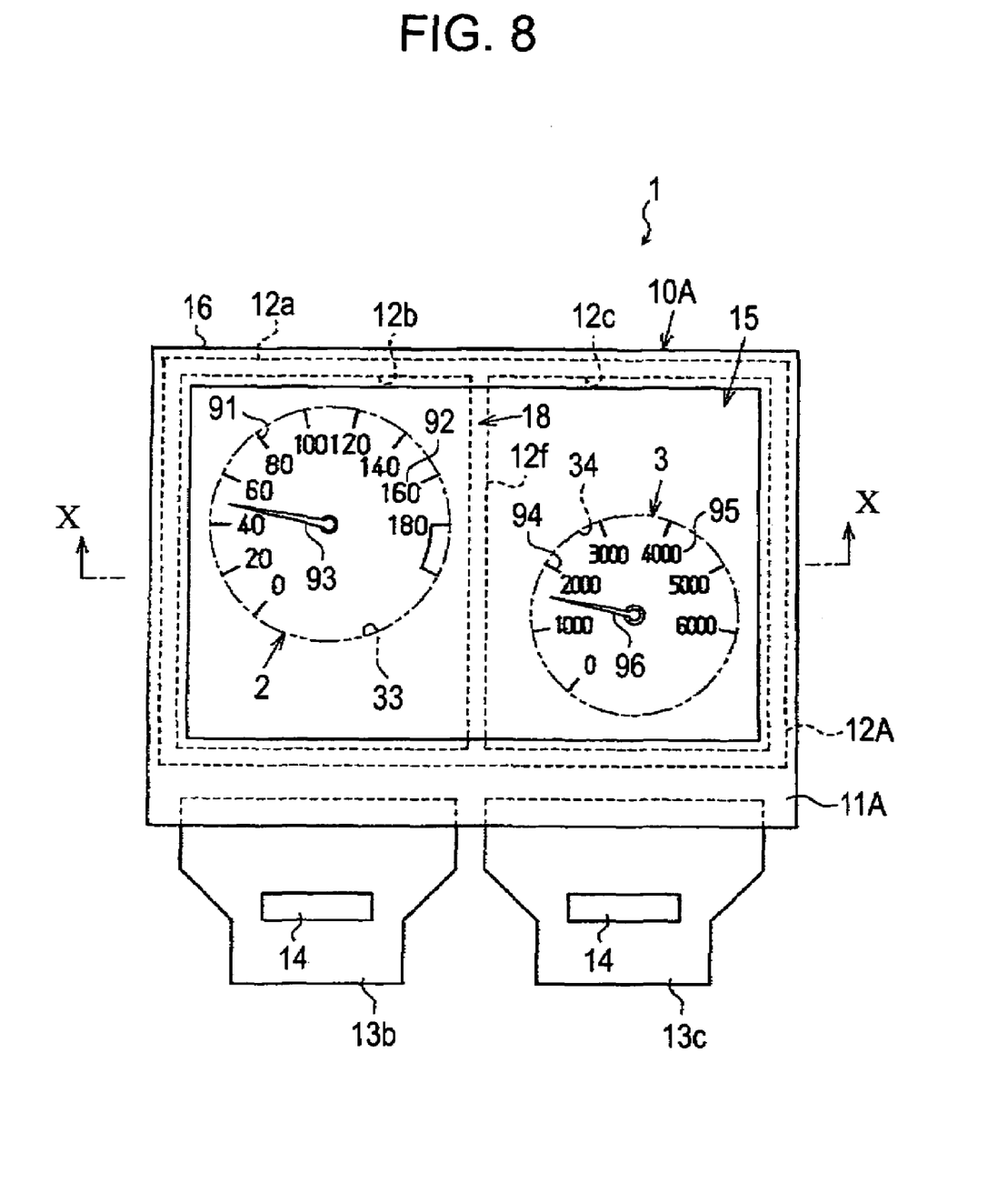
FIG. 8 is a plan view showing an entire organic EL panel according to a second embodiment of the invention.

In the organic EL panel 10A of the display module 1 for a mobile shown in FIG. 8, by the real display region 2 on the left side, the scales 91, the figures 92, and the indicator 93 of the speedometer are displayed. Further, by the real display region 3 on the right side, the scales 94, the figures 95, and the indicator 96 of the tachometer are displayed.

Figure 9:
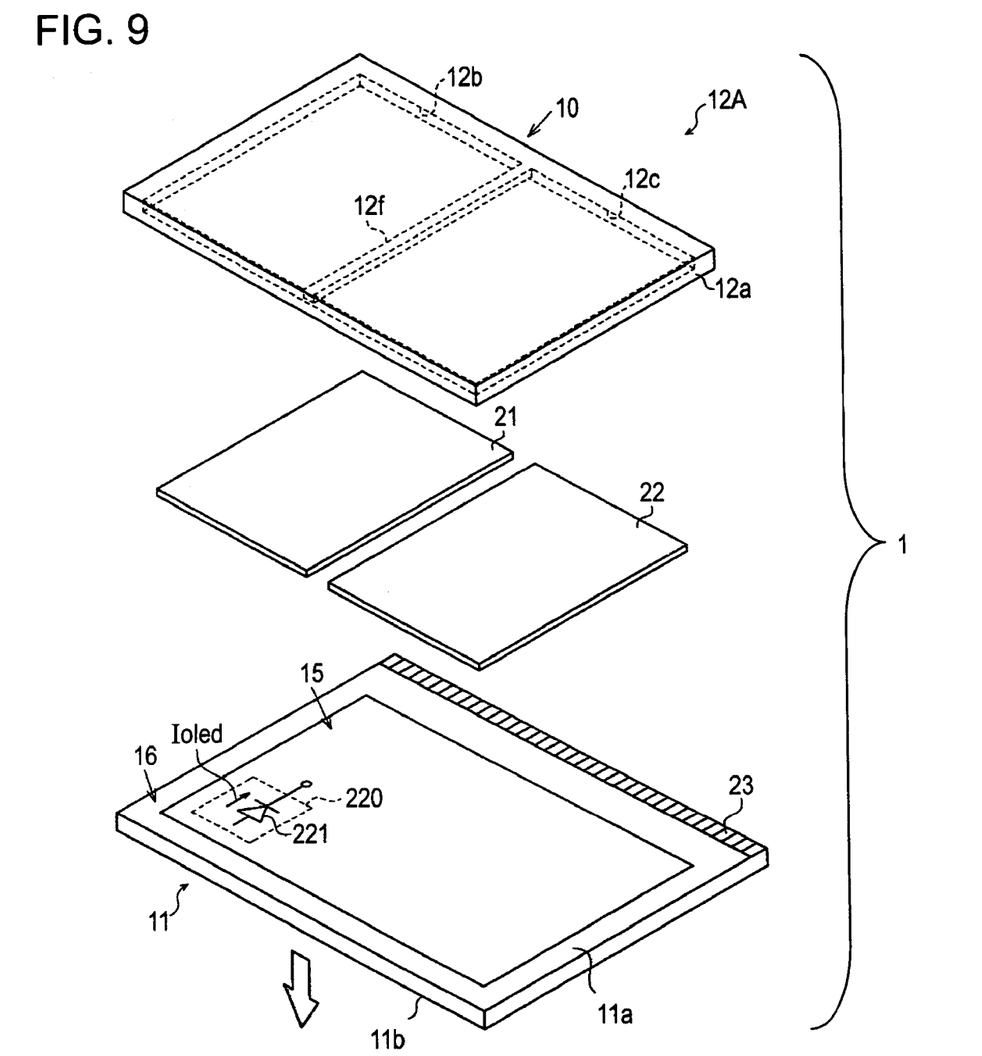
FIG. 9 is an exploded perspective view showing the organic EL panel.
Figure 10:
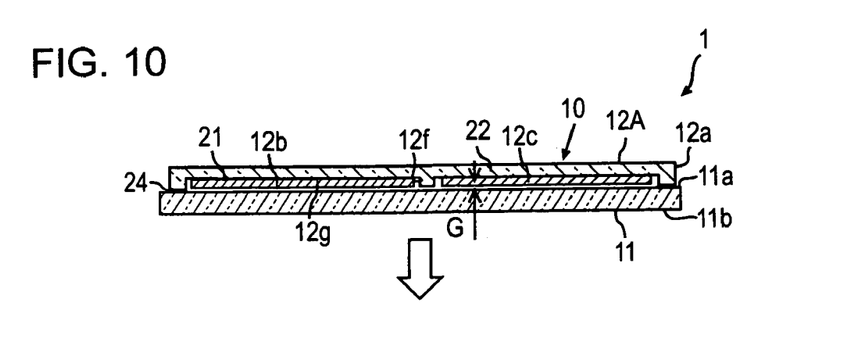
FIG. 10 is a cross-sectional view taken along the line X-X of FIG. 8.
Figure 11:
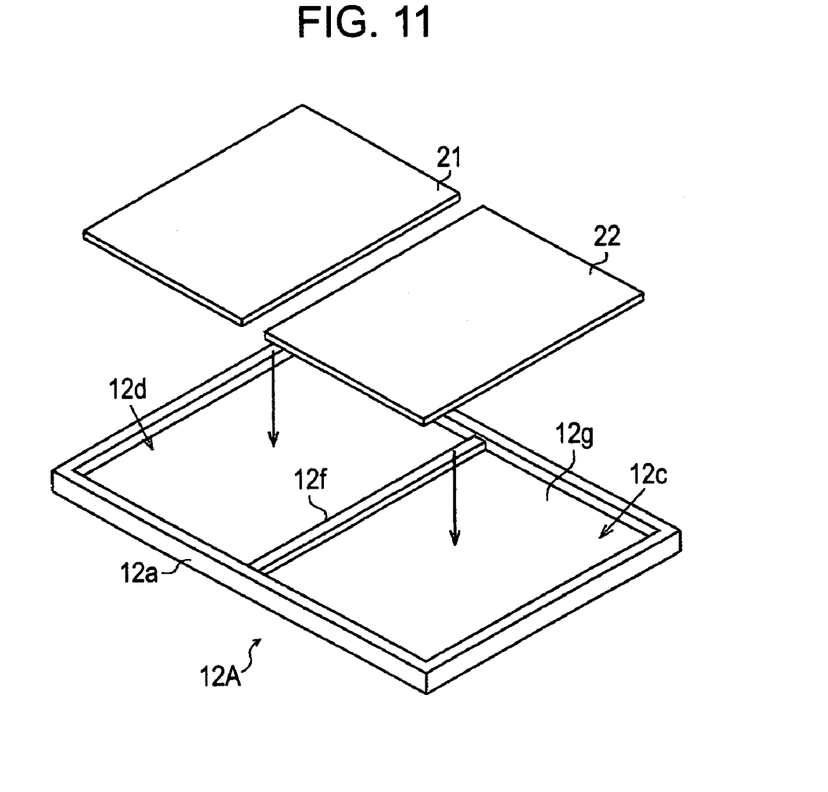
FIG. 11 is an exploded perspective view showing a sealing substrate and a desiccant of the organic EL panel.

In the present embodiment, in a sealing substrate 12A, as shown in FIGS. 9 to 11, two concave portions 12b and 12c are formed. The two concave portions 12b and 12c correspond to the two real display regions 2 and 3 shown in FIG. 8. Each of the concave portions 12b and 12c houses organic EL elements 221 of a plurality of pixels 220 within each real display region.

Further, in the sealing substrate 12A, one reinforcing member 12f which protrudes so as to have a gap G (see FIG. 10) with respect to cathode of each of the organic EL elements 221 is formed. The reinforcing member 12f is provided so as to be located within a non-display region 18 (see FIG. 8) between the two real display regions 2 and 3.

In the sealing substrate 12A having such a configuration, the two concave portions 12b and 12c are divided by the reinforcing member 12f and form separate spaces. Further, as shown in FIGS. 9 to 11, in the two concave portions 12b and 12c, plate-shaped desiccants 20 and 21 for absorbing moisture are adhered to an inner surface 12g of the sealing substrate 12A to be individually housed.

Figure 5:
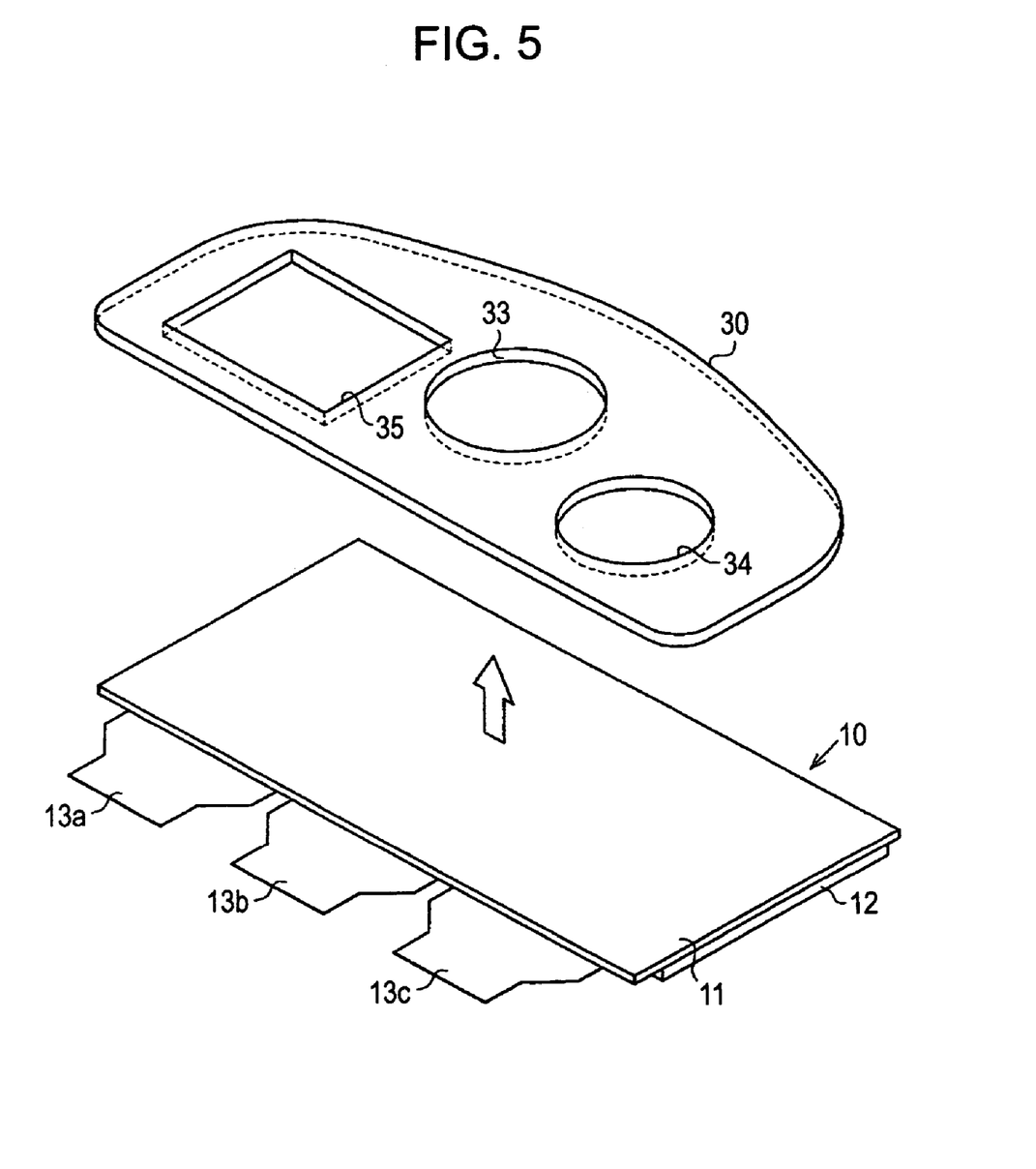
FIG. 5 is an exploded perspective view showing the organic EL panel and a panel cover.

In addition, as shown in FIG. 8, the display module 1 for a mobile having such an organic EL panel 10A has two flexible wiring boards 13b and 13c which are connected to the light-emitting-element substrate 11 of the organic EL panel 10A, and a panel cover 30 (see FIG. 5). Further, on each of the flexible wiring boards 13b and 13c, a driver IC 14 including a data line driving circuit which drives the organic EL elements 221 of each of the two real display regions 2 and 3 is mounted.

In the organic EL panel 10A having such a configuration which is used in the display module 1 for a mobile, if the sealing substrate 12A is curved from a state shown in FIG. 10 toward the organic EL elements 221 of the light-emitting-element substrate 11, the front end of the reinforcing member 12f hits the cathode of each of the organic EL elements 221, and thus the sealing substrate 12A is deterred from being deformed beyond that, such that the sealing substrate 12A is prevented from being damaged.

According to the second embodiment having such a configuration, the same advantages as those in the first embodiment can be obtained.

Third Embodiment

Figure 12:
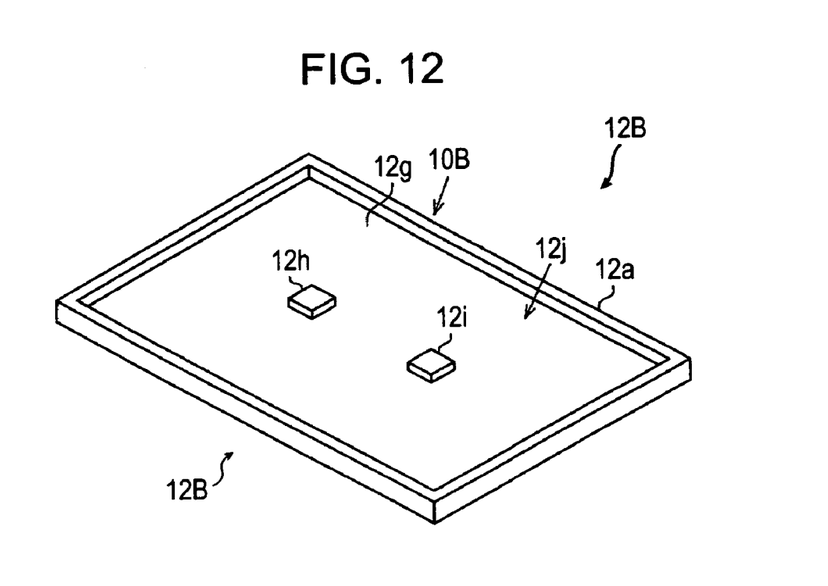
FIG. 12 is a perspective view showing a sealing substrate of an organic EL panel according to a third embodiment of the invention.

An organic EL panel 10B according to a third embodiment will be described with reference to FIG. 12. In the organic EL panel 10B, like the first embodiment, the number of a plurality of real display regions displaying different images within the effective display area 15 (see FIG. 1) is three. The organic EL panel 10B is different from the organic EL panel 10 of the first embodiment in that two reinforcing members 12h and 12i provided in the sealing substrate 12B have individually protrusions spaced apart from the rectangular convex portion 12a, unlike the reinforcing members 12e and 12f. Further, a concave portion 12j of the sealing substrate 12B is a space around the two reinforcing members 12h and 12i. Accordingly, in the sealing substrate 12B, in the space around of the two reinforcing members 12h and 12i in the concave portion 12j, one or a plurality of plate-shaped desiccants (not shown) for absorbing moisture are adhered to an inner surface 12g to be housed. Other parts are the same as those in the first embodiment.

According to the third embodiment having such a configuration, the following advantages can be obtained.

The two reinforcing members 12h and 12i have individually the protrusions spaced apart from the rectangular convex portion 12a, and thus, with the protrusions, the sealing substrate 12B can be prevented from being damaged.

In the space around of the reinforcing members 12h and 12i in the concave portion 12j of the sealing substrate 12B, one or a plurality of plate-shaped desiccants (not shown) for absorbing moisture are adhered to the inner surface 12g to be housed. Therefore, moisture intruding into the concave portion 12j of the sealing substrate 12B can be absorbed by the desiccant, and thus the organic EL elements 221 can be prevented from being degraded.

Fourth Embodiment

Figure 13:
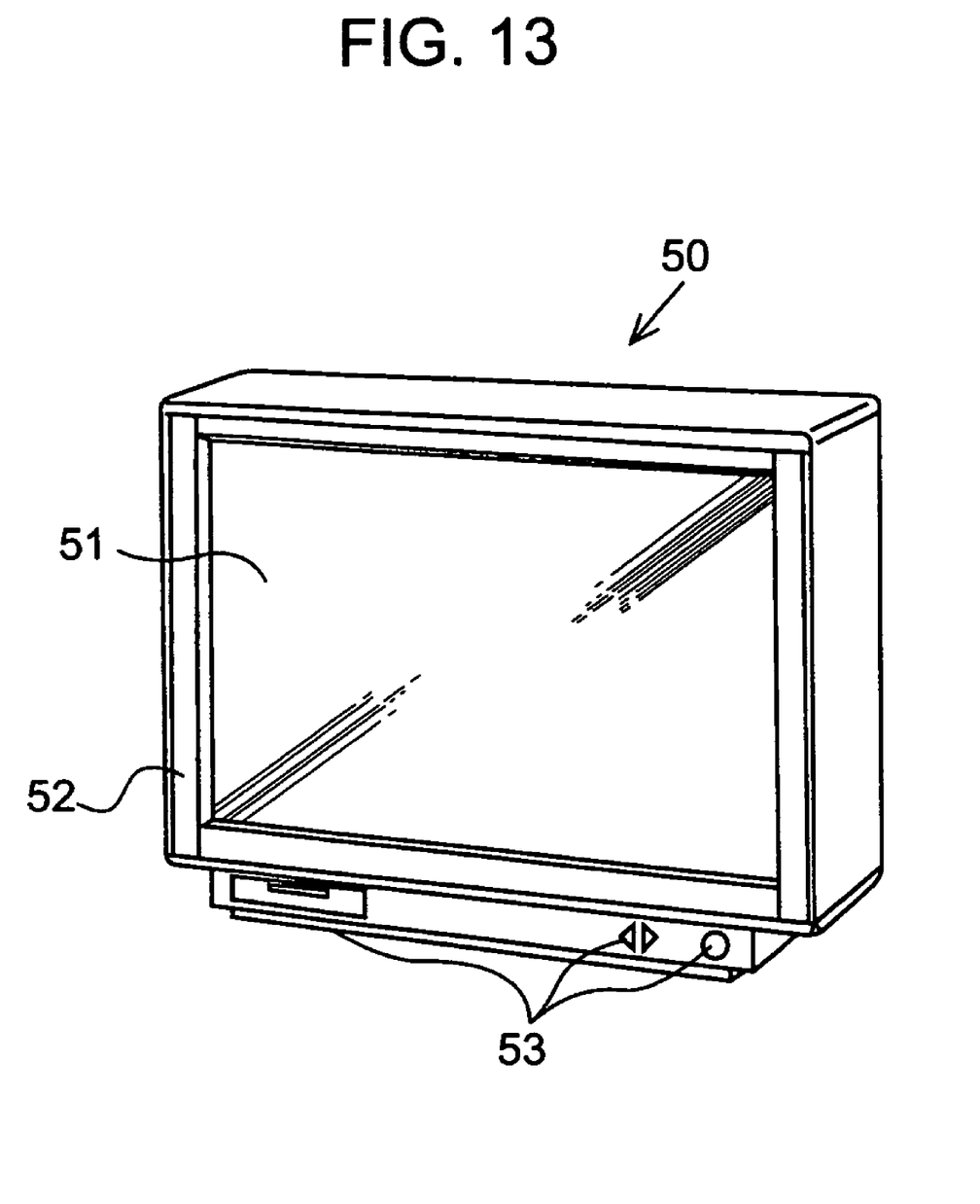
FIG. 13 is a perspective view showing a large television as an electronic apparatus.

Next, an example of an electronic apparatus using the organic EL panel described in each of the above-described embodiments will be described with reference to FIG. 13. FIG. 13 is a perspective view of a large television 50. The large television 50 has a display unit 51 for a large television which uses the organic EL panel 10 having the large size described in the first embodiment, a speaker 52, and a plurality of operating buttons 53, for example.

According to the fourth embodiment having such a configuration, the large television 50 in which the size of the display unit 51 is increased and which is reduced in thickness can be implemented. Further, even when the size of the display unit 51 is increased, the large television 50 which can perform high-quality display with long life span can be implemented.

Moreover, the invention can be modified and specified as follows.

In each of the above-described embodiments, the organic EL panel which is used as a display panel in an organic EL display has been described as an example, but the invention can be applied to a display panel which is used in a fluorescent plasma display using discharge, or a display panel which is used in a display using an electron emission element (FED) or a SED (Surface-Conduction Electron-Emitter Display). In this case, the same effects as those in each of the above-described embodiments can be obtained.

In the first embodiment, the configuration in which the organic EL panel 10 has the three real display regions 2 to 4 displaying different images within the effective display area 15 has been described. Further, in the second embodiment, the configuration in which the organic EL panel 10A has the two real display regions 2 and 3 has been described. However, the invention is not limited to these configurations. For example, the invention can be applied to a configuration in which an organic EL panel has a plurality of real display regions, excluding 'two' or 'three' real display regions, within the effective display area 15.

In the first embodiment, the organic EL panel 10 is configured such that the image of the speedometer is displayed by the central real display region 2, the image of the tachometer is displayed by the real display region 3 on the right side, and the image 97, such as the map information of the car navigation device or the like, is displayed by the real display region 4 on the left side. However, the invention is not limited to this configuration. For example, the invention can be also applied to a configuration in which other kinds of images are individually displayed by the real display regions, or display positions of the images are different.

In the first embodiment, the display module 1 for a mobile which the organic EL panel 10 is mounted on the vehicle, such as an automobile or the like, as the mobile has been described as an example. However, the invention can be also applied to a display module of a mobile which is mounted on an aircraft, a vessel, a trolley car, a two-wheeled vehicle, or the like, excluding the vehicle.

In the fourth embodiment, as an example of an electronic apparatus which uses the organic EL panel described in each of the first to third embodiments, the large television 50 has been described. However, according to the invention, the organic EL panel described in each of the first to third embodiments can be also applied to an electronic apparatus, excluding the television, which uses a large display.

The invention is widely applied to an organic EL display device which uses the organic EL panel described in each of the first to third embodiments, or other electronic apparatuses.

What is claimed is:

1. A display panel comprising:
    a light-emitting-element substrate having a light-emitting element including a pair of electrodes and a functional layer in between the electrodes,
    a sealing substrate that is bonded to the light-emitting-element substrate so as to airtightly seal the entire light-emitting element,
    in the sealing substrate, a concave portion that houses the light-emitting elements of the plurality of pixels therein being formed, and
    on an inner surface of the sealing substrate facing the light-emitting element, a reinforcing member that protrudes toward the light-emitting element substrate; and
    a cavity between the reinforcing member and the light-emitting-element substrate,
    the light-emitting-element including an upper electrode, and
    the reinforcing member protruding toward the upper electrode such that when the sealing substrate is compressed, a front end of the reinforcing member contacts the upper electrode of the light-emitting-element.

2. The display panel according to claim 1,
    the display panel having a plurality of display regions displaying different images within an effective display area, and
    the reinforcing member being provided so as to be located in non-display regions among the plurality of display regions.

3. The display panel according to claim 2, the sealing substrate having a rectangular convex portion that surrounds the concave portion, and the reinforcing member having bridges that extend between two opposing convex portions of the rectangular convex portion.

4. The display panel according to claim 3, the concave portion of the sealing substrate being divided into a plurality of concave portions by the reinforcing member, and in each of the plurality of concave portions, a plate-shaped desiccant for absorbing moisture being housed to be adhered to the inner surface.

5. The display panel according to claim 2, the sealing substrate having a rectangular convex portion that surrounds the concave portion, and the reinforcing member having a protrusion that is spaced apart from the convex portion.

6. The display panel according to claim 5, a plate-shaped desiccant for absorbing moisture being housed in a space around the protrusion in the concave portion of the sealing substrate to be adhered to the inner surface.

7. The display panel according to claim 1, the light-emitting element being an electroluminescent element.

8. A display module for an automobile comprising the display panel according to claim 1.

9. An electronic apparatus comprising the display panel according to claim 1.

10. The display panel according to claim 1, the light-emitting-element substrate further having a plurality of pixels each having the light-emitting element and arranged in a matrix shape.

11. An electroluminescent device comprising:

a light-emitting-element substrate having a light-emitting element including a pair of electrodes and a functional layer therebetween;

a sealing substrate having a concave portion that houses the light-emitting element, and that is bonded to the light-emitting-element substrate; and a protrusion formed inside the concave portion; and a cavity between the light-emitting-element substrate and the protrusion, the light-emitting-element including an upper electrode, and the protrusion facing the upper electrode such that when the sealing substrate is compressed, a front end of the protrusion contacts the upper electrode of the light-emitting-element.

12. The electroluminescent device according to claim 11, the electroluminescent device having a display region for displaying an image, and a non-display region where no image is displayed, the protrusion only being provided in the non-display region.

13. The electroluminescent device according to claim 12, further comprising a second display region for displaying an image, and a non-display region where no image is displayed, the non-display region being provided between the display region and the second display region.

14. The display panel according to claim 1, the reinforcing member being formed integrally with the sealing substrate.

15. The electroluminescent device according to claim 11, the protrusion being formed integrally with the sealing substrate.

16. The display panel according to claim 1, the display panel having a display region for displaying an image, and a non-display region where no image is displayed, the reinforcing member only being provided in the non-display region.

* * * * *